United States Patent [19]
Kim et al.

[11] Patent Number: 6,160,306
[45] Date of Patent: Dec. 12, 2000

[54] DIODE OF SEMICONDUCTOR DEVICE AND METHOD FOR MANUFACTURING THE SAME

[75] Inventors: Nam-jin Kim, Paju; Ho-hyun Kim, Seoul, both of Rep. of Korea

[73] Assignee: Samsung Electronics Co., Ltd., Suwon, Rep. of Korea

[21] Appl. No.: 09/313,198

[22] Filed: May 18, 1999

[30] Foreign Application Priority Data

May 20, 1998 [KR] Rep. of Korea ............ 98-18200

[51] Int. Cl.[7] ............................................. H01L 31/0352
[52] U.S. Cl. ................................... 257/653; 257/654
[58] Field of Search ............................ 257/104, 105, 257/106, 497, 603, 604, 605, 652, 653, 654

[56] References Cited

U.S. PATENT DOCUMENTS

4,071,852  1/1978  Kannam .
4,458,260  7/1984  McIntyre et al. .
5,432,360  7/1995  Kim et al. .

*Primary Examiner*—Ngân V. Ngô
*Attorney, Agent, or Firm*—Jones Volentine, LLC

[57] ABSTRACT

A semiconductor diode device having the characteristic of soft recovery and a method for manufacturing the same. A first N+ layer contacts with a cathode electrode. An N− epitaxial layer is formed on the first N+ layer. A P− layer is formed to have an undulating junction with the N− epitaxial layer. A second N+ layer is embedded in the P− layer. An anode electrode is attached to the P− layer, wherein the anode contact to the P− layer includes the second N+ layer. A channel stop region and insulating layer are also added to the structure.

16 Claims, 7 Drawing Sheets

DIODE OF SEMICONDUCTOR DEVICE AND METHOD FOR MANUFACTURING THE SAME

BACKGROUND OF THE INVENTION

1. Field of the Invention

The present invention relates to a semiconductor diode device having characteristics of slow reverse current reduction, i.e., soft recovery, and to a method for fabricating the same.

2. Description of the Related Art

A diode normally includes an anode region and a cathode region with a junction there between. The cathode region is designed using an N type impurity to contain major carriers (i.e., electrons) and the anode region is designed using a P type impurity to contain major carriers (i.e., holes).

A carrier depletion region may exist on both sides of the junction of the diode device due to an effect where carrier types disappear near the junction due to a recombination process. For example, an electron in an N type impurity layer situated near the junction may be recombined with a hole which has diffused across the junction from a P type impurity region causing the electron to disappear. Similarly an electron may diffuse across the junction and recombine with a hole in the P type impurity layer making the hole disappear from that location. The depletion region which results from this effect consists of depleted electrons on the N side of the junction creating a positive charge and depleted holes on the P side of the junction creating a negative charge.

When a more positive voltage is applied to an anode and a more negative voltage is applied to a cathode, the diode is placed in a forward biased state whereby majority carriers are supplied into both impurity type regions. Near the junction, holes are injected into the N type impurity layer from the P type impurity layer where they become minority carriers, and electrons are injected into the P type impurity layer from the N type impurity layer where they become minority carriers. Majority carriers injected into each impurity layer neutralize some of the charge present in the depletion region causing it to narrow. As the depletion region width narrows, a depletion barrier voltage decreases and majority carriers are allowed to cross the barrier enabling a current flow through the diode.

Considering a reversal of the above applied electrical polarities; when the negative voltage is applied to the anode and the positive voltage is applied to the cathode, the diode is placed in a reverse biased state. Holes are ejected from the P type impurity layer, electrons are ejected from the N type impurity layer, and majority carriers leaving the impurity regions cause the charge present in the depletion region to increase. As the depletion region width increases, a depletion barrier voltage increases and majority carriers are blocked from crossing the barrier disabling a reverse current flow through the diode.

A breakdown voltage of the diode is a reverse bias voltage of a particular magnitude which allows reverse current to flow due to a breakdown mechanism of the diode when a specific threshold value is exceeded. Thus, the diode must be fabricated to have an adequate breakdown voltage for a given application in order to disallow any reverse current flow which may not be desired.

When a forward biased diode device is initially switched to a reverse biased state, a recovery period is needed for the depletion layer to form and effectively block the current. Until the depletion layer is formed, the reverse current will flow in the diode until the depletion layer is wide enough to effectively block the current flow.

A time defined by a period starting at a point where the diode is switched initially from a forward bias state to a reverse bias state, to the time where the current flow is blocked in the reverse biased state is expressed as a recovery rate. The recovery rate of a diode may also be described as a time required for the minority charge removal during a period from which the diode switches from a conducting state to a reverse biased state. The present invention relates to a diode device having the characteristic of a long recovery period (i.e., soft recovery).

Figure 1:
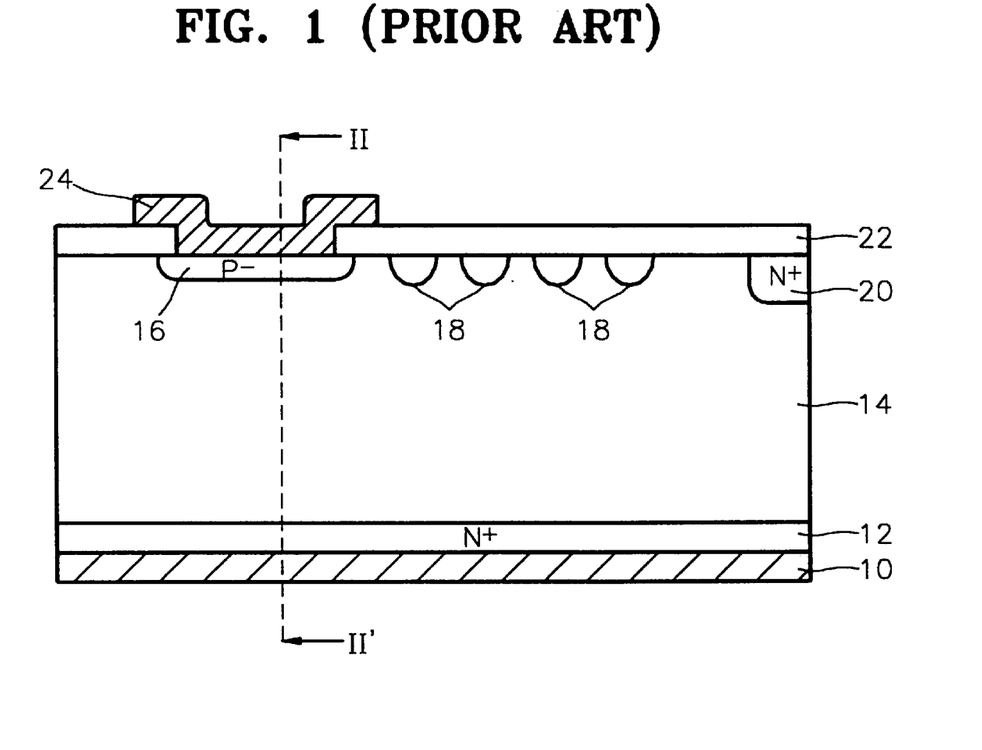
FIG. 1 is a representational cross-section view of a diode fabricated in accordance with a first technique of the prior art whereby a P-layer has a shallow junction to obtain the characteristic of soft recovery.

A representational cross-section view of a diode having the characteristic of soft recovery fabricated in accordance with a first prior art technique is illustrated in FIG. 1.

The diode includes a shallow P– layer 16 and deeper P-type layer rings 18 for increasing a breakdown voltage of the diode. In the forward biased state, the amount of hole carriers injected into the N type impurity layer is less than the amount of electron carriers injected into the P type impurity layer thus achieving a characteristic of soft recovery. However, the different depths of the P– layer 16 and P-type layer rings 18 increase the number of mask and forming steps in the process, thereby decreasing productivity and increasing semiconductor production costs.

The steps of forming the diode of FIG. 1 include: forming an N– epitaxial layer 14 on an N+ layer 12; forming a shallow P– layer 16 on the surface of the N– epitaxial layer 14; forming P– type impurity rings 18 around the P– layer 16 to adjust the breakdown voltage of the diode; forming an N+ channel stop layer 20 to prevent the lateral extension of the depletion layer; attaching an anode 24 to the shallow P– layer 16; and attaching a cathode 10 to the N+ layer 12.

The anode electrode 24 is attached to the shallow P– layer 16 by selectively opening a contact window and patterning a conductor contact to form the anode electrode 24. The shallow depth of the P layer 16 which may be between 2 $\mu$m and 4 $\mu$m may result in an unreliable contact base for the anode electrode 24.

Figure 2:
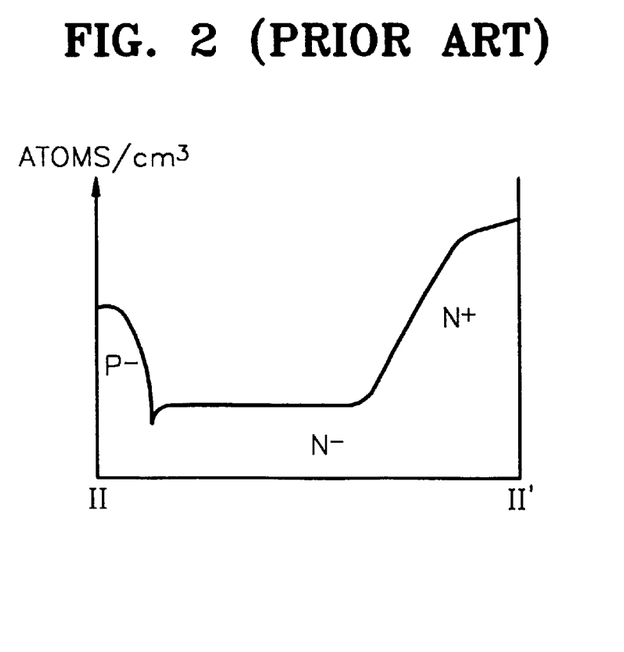
FIG. 2 is a graph illustrating the impurity concentration distributions of a section taken along line II-II' of FIG. 1.

FIG. 2 represents an impurity concentration distribution profile taken along the line II-II' of FIG. 1. The impurity concentration profile includes a shallow lightly doped P– region (16), a lightly doped N– region (14) and a heavily doped N+ region (12).

In this first technique according to the prior art, the formation of a shallow P type impurity layer will result in a diode which exhibits increased electron carrier injection into the cathode and decreased hole carrier injection into the anode thereby obtaining the characteristic of soft recovery.

However, the method according to the first prior art technique includes an unreliable step of forming an electrode contact on a shallow impurity layer.

In addition, the method according to the first prior art technique includes additional masks and formation steps for obtaining a desired reverse breakdown voltage.

A method for obtaining the characteristic of soft recovery in the semiconductor diode fabricated in accordance with a second prior art technique uses a deep P type impurity layer to avoid the reliability issues involved with contacting to a shallow impurity region according to the first technique of the prior art.

In addition, separate mask and processing steps for forming P type impurity rings 18 (FIG. 1) are unnecessary when the reverse breakdown voltage characteristic is adequate in, for example, a diode which includes a deep undulating shaped P type impurity layer.

Figure 3:
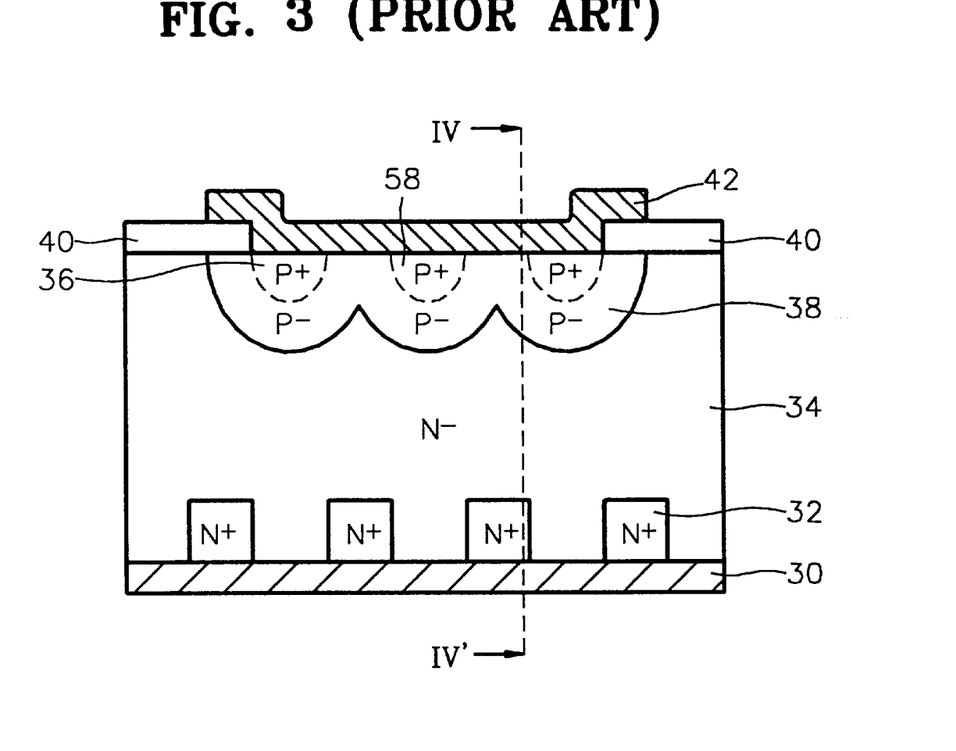
FIG. 3 is a representational cross-section view of a diode fabricated in accordance with a second technique of the prior art whereby a P-layer has an undulating shaped junction to obtain the characteristic of soft recovery.

With reference to FIG. 3, the method according to the second prior art technique includes: forming N+ layers 32 spaced apart from each other by a distance on a first major surface of an N– epitaxial layer 34; forming an embedded P– layer 38 in the N– epitaxial layer 34 having an undulating shaped junction with a second major surface of the N– epitaxial layer 34; applying an insulating mask layer (not shown) on the second major surface and patterning for use in selectively forming a P+ layer 36 embedded in the P– layer 38; forming the P+ layer 36 by diffusion within the P– layer 38; forming an insulating layer 40 and an anode 42 attached to the P+ layer 36 and the P– layer 38; and forming a cathode 30 connected to the N+ layer and the N– epitaxial layer 34.

Figure 4:
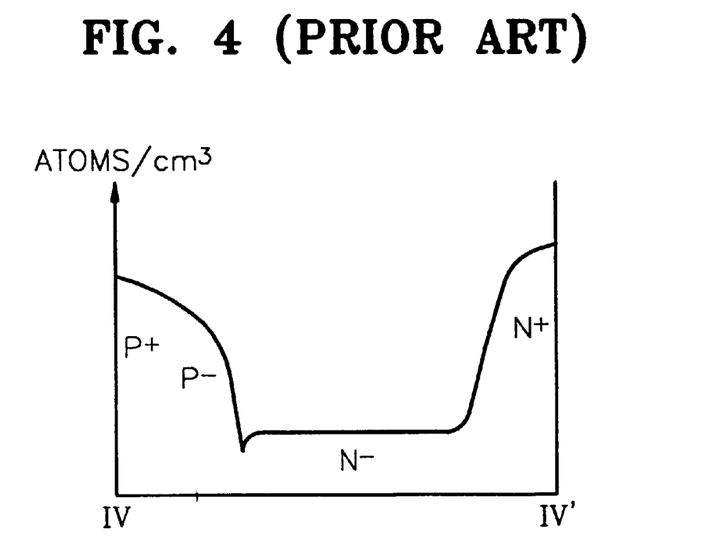
FIG. 4 is a graph illustrating the impurity concentration distributions of a section taken along line IV-IV' of FIG. 3.

FIG. 4 represents an impurity concentration distribution profile taken along the line IV-IV' of FIG. 3. The impurity concentration profile includes a deep anode region consisting of a heavily doped P+ region (36) and a lightly doped P– region (38), and a cathode region consisting of a lightly doped N– region (34) and a heavily doped N+ region (32).

The technique for forming a diode in accordance with the second prior art technique uses a P layer with a deep undulating shaped junction to avoid the reliability issues involved with contacting to a shallow impurity region encountered in the technique according to a first prior art technique. This second technique also does not require separate mask and processing steps needed for forming P type impurity rings to adjust the reverse breakdown voltage characteristic.

However, since the P– layer 38 junction depth is deeper than that of the diode formed according to the first prior art technique, the hole carrier injection into the N type impurity region during the forward bias state is greater than electron carrier injection into the P type region. Thus a diode formed in accordance with this method has a faster recovery time and a shortcoming exists for extending the recovery time to provide an adequate soft recovery characteristic.

Accordingly, there is a need for a diode exhibiting enhanced characteristics of soft recovery and a method for fabricating a soft recovery diode structure which exhibits such enhanced soft recovery characteristics.

SUMMARY OF THE INVENTION

It is an object of the present invention to provide a diode exhibiting characteristics of soft recovery, and a method for fabricating a soft recovery diode structure which exhibits enhanced soft recovery characteristics, by having increased electron carrier injection into an anode impurity region and decreased hole carrier injection into the cathode impurity region during a forward bias state.

It is another object of the invention to provide a method for making an enhanced soft recovery diode which uses a deep impurity type region to form a reliable contact with an anode electrode.

It is another object of the invention to provide a method for making a soft recovery diode which minimizes processing steps in forming a diode structure while achieving a desired reverse breakdown voltage characteristic.

In a first principle aspect, the present invention is a method for forming a semiconductor diode device which exhibits the characteristic of slow reverse current reduction or soft recovery. More specifically, this aspect of the invention exhibits enhanced soft recovery as compared to those diodes exhibiting soft recovery fabricated in accordance with prior art techniques. Soft recovery characteristics are enhanced in a diode structure by having increased electron carrier injection into an anode impurity region and decreased hole carrier injection into a cathode impurity region during a forward bias state.

An embodiment of the present invention includes at least a cathode region and a deep anode region with a junction there between. The cathode layer includes at least a first doped layer and a second doped layer of a first conductivity type; for example, an N– epitaxial silicon layer and an N+ layer. The anode region includes at least a third doped layer of a second conductivity type having an embedded fourth doped layer of a first conductivity type. For example the third doped layer is P– and the fourth doped layer is N+. The counter doped anode region serves to increase the amount of electron carrier injection with respect to the cathode region during a forward biased state, thereby increasing the recovery time when switched to a reverse biased state.

In a method for forming the present invention in accordance with a first embodiment, a step of forming a deep anode region which includes an embedded counter doped layer is included thereby not requiring any additional impurity layers for adjusting a reverse breakdown voltage characteristic. The deep anode region ensures a reliable contact structure to an anode electrode and avoids the unreliable shallow junction and contact formed in the first prior art technique.

Processing steps are minimized in the method above by forming two doped layers of opposite conductivity type in the anode region concurrently. As an example, a single mask can be used by which both impurities can be introduced at the same time.

In a method for forming the present invention in accordance with a second embodiment, processing steps may be minimized by forming two regions of the same impurity type concurrently. For example an N+ channel stop may be formed concurrently with an N+ impurity layer under the anode electrode by opening an additional mask window over the channel stop region.

The method for forming the present invention in accordance with a first embodiment includes: forming a first doped layer such as a lightly doped (N–) epitaxial (or crystalline silicon)layer on a second doped layer such as a heavily doped (N+) type impurity region; and selectively introducing a first type impurity, such as a lightly doped (P–) impurity, and a second type impurity, such as an N+ impurity, to form a third doped layer having a junction with the second doped layer and a fourth doped layer having a junction with the third doped layer. The third and fourth doped layers are counter-doped regions of the anode region which is attached to an anode electrode. The first and second doped layers are included in the cathode region which is connected to a cathode electrode.

In addition, a channel stop layer may be formed by introducing a channel stop region to a surface of the second doped layer and an insulating layer may be formed on the channel stop region.

The above method for forming the present invention in accordance with a first embodiment includes a step of concurrently introducing a third doped layer and a fourth doped layer to minimize processing steps. As an example, the third and fourth doped layers may be formed by implanting phosphorous and boron ions for possessing different diffusion coefficients selectively on a surface of the first doped layer. When driven in, the different diffusion coefficients will cause the two impurities to diffuse to different depths.

The method for forming the present invention in accordance with a second embodiment includes: forming a first doped layer such as a lightly doped (N−) epitaxial layer on a second doped layer such as a heavily doped (N+) type impurity region; selectively introducing a first type impurity such as a lightly doped (P−) impurity (e.g., by coating a liquid impurity source and diffusing)to form a third doped layer having a junction with the first doped layer; selectively introducing a second type impurity such as an N+ impurity to form a fourth doped layer having a junction with the third layer and an N+ channel stop region concurrently. The third and fourth layers are counter-doped regions of the anode region which is attached to an anode electrode. The first and second doped layers are included in the cathode region which is connected to a cathode electrode.

The above method for forming the present invention according to the second embodiment includes a step of concurrently introducing a first type impurity to form the fourth layer in the anode region and a channel stop region thereby minimizing processing steps. For example, boron ions may be selectively implanted and diffused to form the fourth doped layer and the channel stop layer. Another example method may involve coating a liquid impurity such as $POCl_3$ on the surface of the second layer and diffusing.

BRIEF DESCRIPTION OF THE DRAWINGS

In the course of the detailed description to follow, reference will be made to the attached drawings in which.

DESCRIPTION OF THE PREFERRED EMBODIMENTS

The present invention is a method for forming a semiconductor diode device which exhibits enhanced characteristics of soft recovery as compared to a diode fabricated according to the prior art techniques. Soft recovery characteristics are enhanced by fabricating a structure which exhibits increased electron carrier injection into an anode electrode and decreased hole carrier injection into the cathode electrode during a forward bias state.

The diode is fabricated to form a reliable structure by using a deep P type impurity layer to contact an anode electrode. In addition, the inclusion of the deep P type impurity layer avoids the need for any extra impurity regions for adjusting a reverse breakdown voltage characteristic thus saving valuable processing time and costs. Since two counter doped impurity regions are formed in the anode region concurrently, processing steps are further minimized and soft recovery characteristics are retained. As an example, a single mask can be used by which both impurities can be introduced at the same time. Another method for minimizing process steps is achieved by forming two regions of the same impurity type concurrently.

Figure 5:
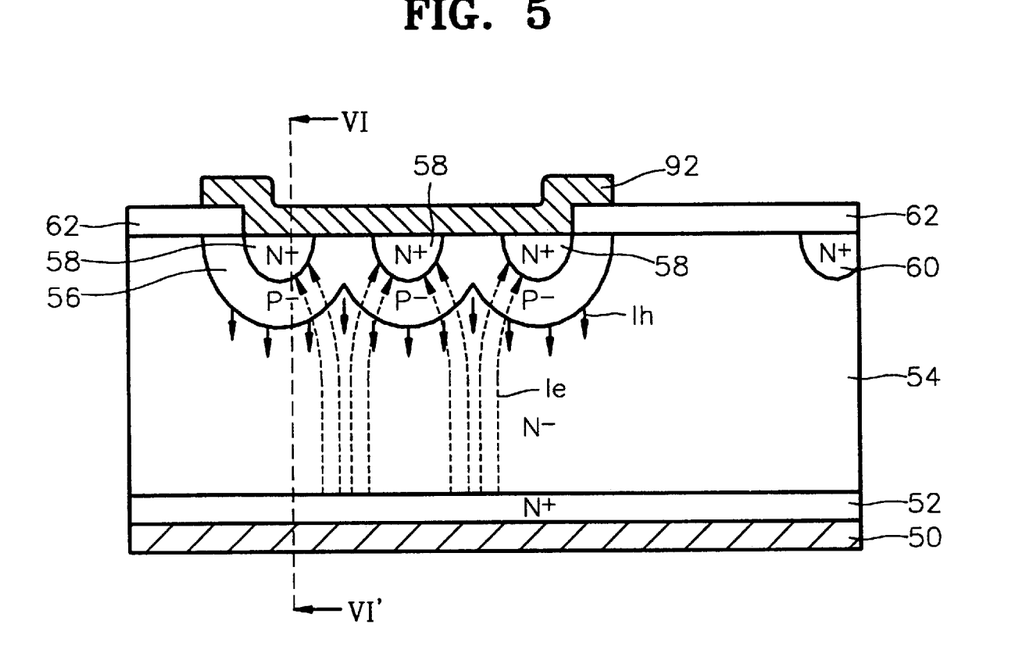
FIG. 5 is a representational cross-section view of a diode of the present invention having the characteristic of soft recovery whereby an anode region includes an N+ layer embedded in a P-layer.

With reference to FIG. 5, a representational cross section view of the diode formed in accordance with a preferred embodiment is illustrated. The diode includes a first doped layer 54 of a first conductivity type; for example, a lightly doped (N−) epitaxial layer. The first doped layer 54 may be formed on a second doped layer 52 of the first conductivity type; for example, a heavily doped (N+) type impurity region disposed on a cathode electrode 50. Embedded in the first doped layer 54 is a third doped layer 56 of a second conductivity type such as a lightly doped (P−) layer. The third doped layer 56 has a junction such as a wave-form or undulating shaped junction, with the first doped layer 54. Embedded in the third doped layer 56 is a fourth doped layer 58 of the first conductivity type; for example, a heavily doped (N+) layer. The fourth doped layer 58 has a second junction with the third doped layer 56. The third doped layer 56 and the fourth doped layer 58 are both attached to an anode electrode 92, and the contact portion of the anode is surrounded by an insulating layer 62.

In this embodiment, a channel stop region 60 is included at a depth in the first doped layer 54 similar to the fourth doped layer 58 for integrating the diode device with other semiconductor devices on a semiconductor substrate.

The anode region includes the fourth doped layer 58 which is embedded into and is of opposite conductivity type to that of the third doped layer 56. This structure of the anode region enhances the characteristic of soft recovery by reducing the amount of carriers injected into the cathode region during a forward biased state. The fourth doped layer 58 embedded in the third doped layer 56 reduces the amount of hole carriers injected to the cathode region from the third doped layer 56, as compared to the second prior art technique. Thus, according to the diode of FIG. 5, the amount of electrons injected to the anode is more than that of holes injected to the cathode, to thereby enhance the soft recovery characteristics. Also, according to the diode of the present invention, paths of electron current Ie and hole current Ih are shortened as indicated by the dotted lines and solid lines of FIG. 5, to thereby lower the forward voltage. That is, if the path of the carriers, i.e., electrons or holes, is shortened, the resistance caused by injection is also reduced, to thereby lower the forward voltage.

As an example, the third doped layer 56 (FIG. 5) has a deep undulating shaped junction embedded in the first doped layer 54 at a depth of about 18 $\mu$m and the fourth doped layer 58 is embedded in the third doped layer 56 at a thickness of about 6 $\mu$m. Other shapes and depths of these layers may be used to increase the recovery time of the diode.

Figure 6:
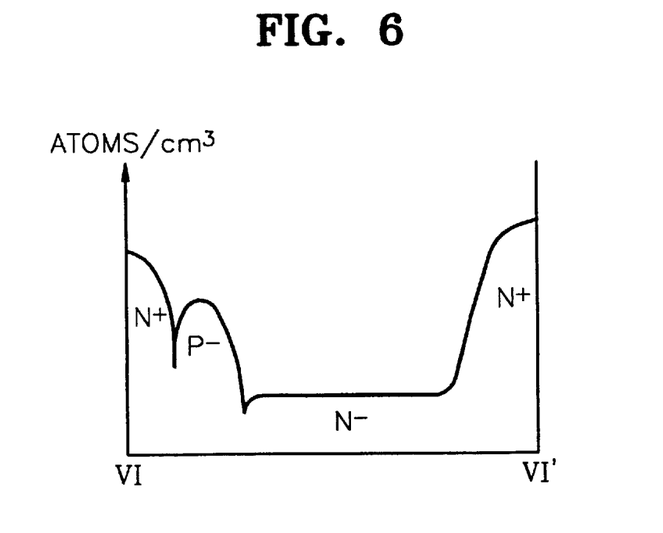
FIG. 6 is a graph illustrating the impurity concentration distributions of a section taken along line VI-VI' of FIG. 5.

FIG. 6 represents an impurity concentration distribution profile taken along the line VI-VI' of FIG. 5. The impurity concentration profile includes a deep anode region consisting of a heavily doped N+ region (58) and a lightly doped P− region (56), and a cathode region consisting of a lightly doped N− region (54) and a heavily doped N+ region (52).

Figure 7A:
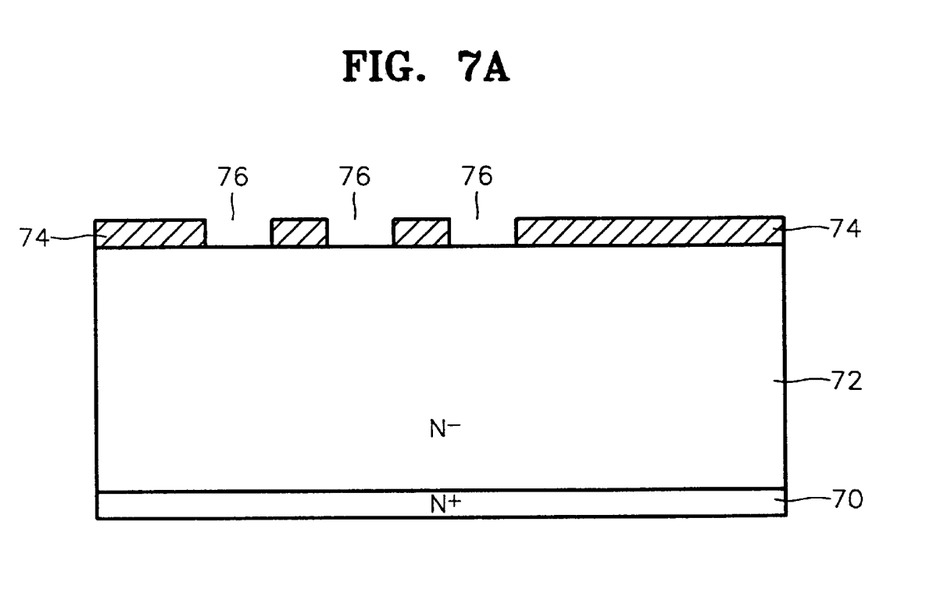
FIGS. 7A–7D are representational cross-section views of selected fabrication stages for fabricating a diode in accordance with a first embodiment of the present invention.

FIG. 7A is a representational cross section view of a diode having undergone several processing steps in accordance with a first embodiment of the present invention. A first doped layer 72 such as N− epitaxial layer is formed on a second doped layer 70 such as an N+ substrate. A first mask pattern 74 is formed on the first doped layer 72, which has a first window 76 to selectively expose a region to be an anode impurity layer in the next step. In this example, a photo resist mask pattern is used. Other materials for the first mask pattern 74 may be chosen and will depend on the method of forming the subsequent impurity layers. In addition, other methods of selectively introducing impurity type layers may be used.

Figure 7B:
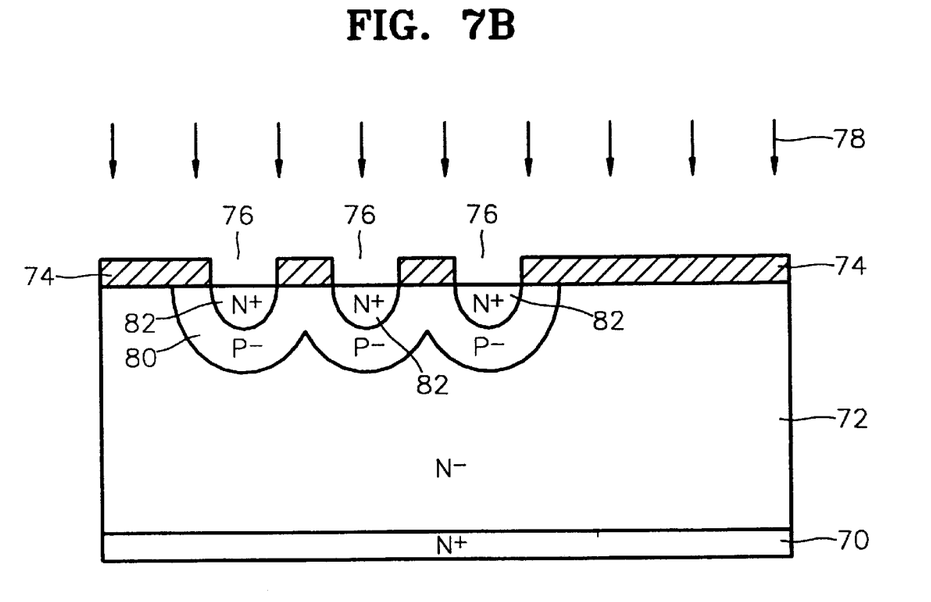

FIG. 7B illustrates the formation of a third doped layer 80 of a second conductivity type such as a lightly doped (P−) layer and a fourth doped layer 82 of a first conductivity type embedded in the first doped layer 72 wherein the third doped layer 80 has a junction with the first doped layer 72 and the fourth doped layer 82 is embedded in and has a junction with the third doped layer 80. In this example, the third doped layer 80 and fourth doped layer 82 are selectively introduced by concurrently implanting two impurities 78; a first type impurity; for example a P type impurity, and a second type impurity; for example an N− type impurity, through the set of mask windows 76 in the first mask pattern 74 and diffusing into the first doped layer 72.

Using this technique minimizes processing steps and processing time since the two doped layers are formed at the same time. For example, the first type impurity is chosen for the third doped layer 80 such that it has a higher diffusion coefficient than that of the second type impurity chosen to form the fourth doped layer. That is, the third layer 80 of higher diffusion coefficient impurity will diffuse more rapidly into the first doped layer 72 than the fourth layer 82 of lower diffusion coefficient, thereby embedding the fourth doped layer 82 entirely within the third doped layer 80. As a further example, the first type impurity may include boron and the second type impurity may include phosphorous.

The method of forming a diode in accordance with the first prior art technique required additional rings and thus additional processing to increase the reverse breakdown voltage. In the example of the present invention, the third doped layer 80 is deep and has a smooth undulating shaped junction with the first doped layer 72 which increases the reverse breakdown voltage without the inclusion of any additional processing steps.

Figure 7C:
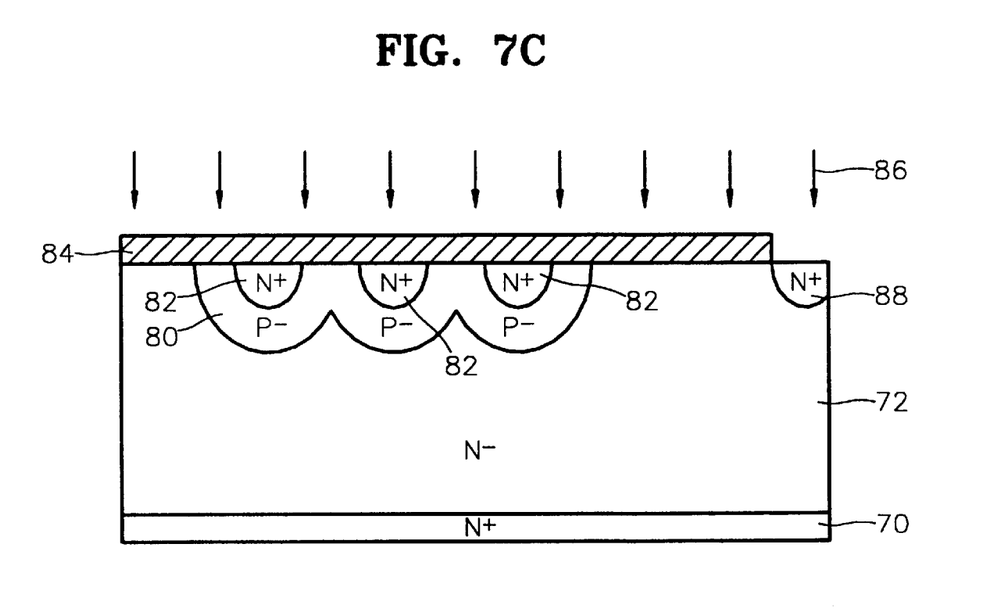

With reference to FIG. 7C, a channel stop region 88 is introduced to isolate the extension of a depletion region caused by applying the reverse voltage to the diode. In this example, an N+ channel stop region 88 is introduced by removing the first mask pattern 74 of FIG. 7B, forming a second mask pattern 84 having a second window exposing a channel stop region in the first doped layer 72. An N-type impurity 86 is implanted through the second window and diffused into the first doped layer 72. Other methods of selectively introducing a channel stop region 88 into the first doped layer 72 may also be employed.

Figure 7D:
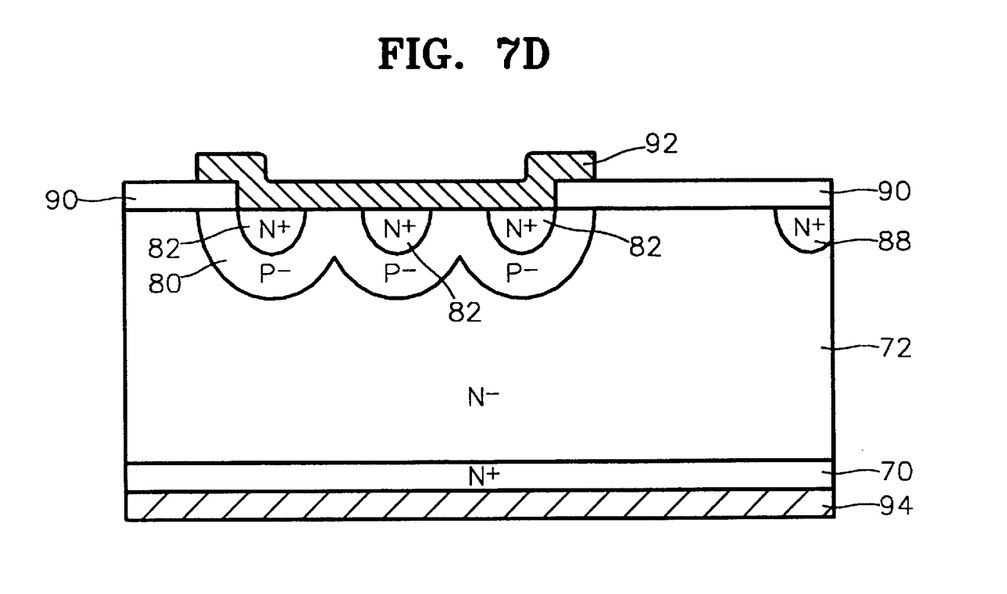

With reference to FIG. 7D, an anode electrode 92 and cathode electrode 94 are disposed on the diode. The second mask pattern 84 of FIG. 7C is removed and an insulating layer 90, for example, an $SiO_2$ layer, is formed on the silicon layer 72. The insulating layer in this example is selectively etched to form a third window exposing the third doped layer 80 and the fourth doped layer 82. A conductive layer such as aluminum is then disposed on a surface of the insulating layer 90 and then patterned to form the anode electrode 92 attached to the third doped layer 80 and the fourth doped layer 82. In this example, the cathode electrode 94 is formed by disposing a metal material such as aluminum, on the second doped layer 70, for example an N+ substrate.

According to the method for manufacturing a diode of the first embodiment of the present invention, the third doped layer 80 has an undulating shaped junction, so that an impurity ring layer for increasing the breakdown voltage of the diode is not required and thus a mask process for forming the ring layer is not additionally required, thereby reducing the number of total processing steps. The undulating shaped junction is deep, thus a reliable ohmic anode electrode contact is formed. Also, the fourth doped layer 82 is concurrently formed together with the third doped layer 80, thereby further minimizing the required number of process steps.

Figure 8A:
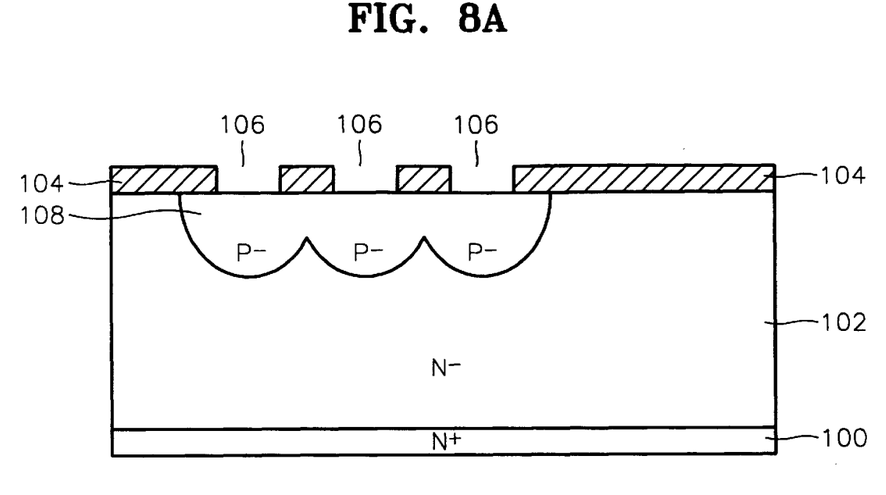
FIGS. 8A–8C are representational cross-section views of selected fabrication stages for fabricating a diode in accordance with a second embodiment of the present invention.
Figure 8B:
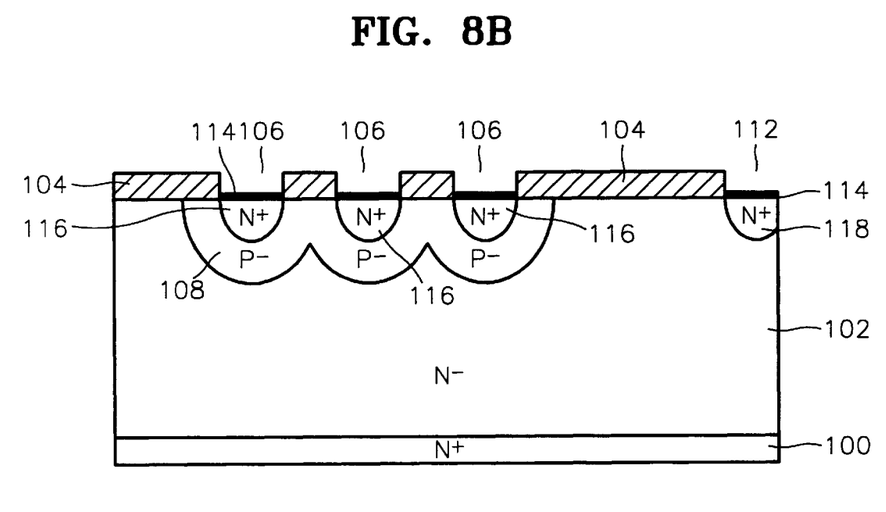
Figure 8C:
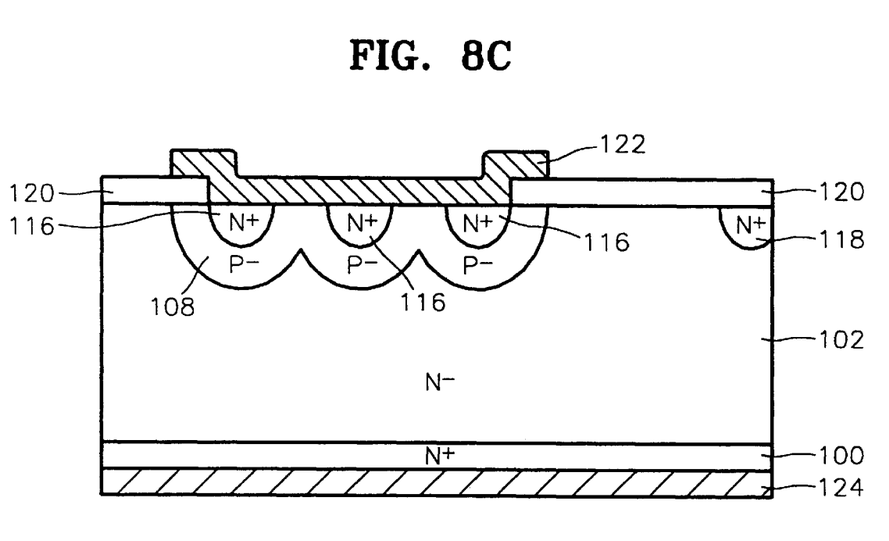

FIGS. 8A–8C are cross-section views illustrating processing steps for forming a diode in accordance with a second embodiment of the present invention. In this example, the third doped layer and the fourth doped layer and a channel stop region are formed in a different manner from the method according to the first embodiment of the present invention.

FIG. 8A is a representation cross section view of a diode having undergone several processing steps in accordance with a second embodiment of the present invention. A first doped layer 102 such as an N− epitaxial layer is formed on a second doped layer 100 such as an N+ substrate. An impurity of a second conductivity type is selectively introduced into the first doped layer 102 to form a third doped layer 108; for example, a P− impurity region. In this example, the impurity of the second conductivity type is selectively introduced by forming a first mask pattern 104 having first windows 106 partially exposing a region which later becomes an anode impurity region. The impurity can then be selectively introduced; for example, ion implantation and diffusion to form the third doped layer 108. Other methods of introducing the third doped layer 108 may also be employed, for example instead of implanting and diffusing, it may be introduced by coating a P type liquid impurity source and selectively diffusing it into the first doped layer 102.

In this example, the third doped layer 108 includes boron ions and has an undulating shaped junction with the first doped layer 102. Other shapes and materials may be employed to achieve the desired impurity type and junction shape.

FIG. 8B illustrates a step for forming a fourth doped layer 116 and a channel stop region 118. In this step, a second window 112 exposing the silicon layer at a channel stop region is opened in the first mask pattern 104. Next, an impurity of the first conductivity type is introduced to concurrently form the channel stop region 118 and the fourth doped layer 116. In this example, an N-type liquid impurity source 114 such as $POCl_3$, is coated on the surface of the third doped layer 108 and the first doped layer 102 exposed through the first and the second windows 106 and 112, and subsequently diffusing the N-type liquid impurity source 114 into the first doped layer 102 and third doped layer 108, to form the fourth doped layer 116 embedded in the third doped layer 108 and the N+ channel stop layer 118, near the surface of the first doped layer 102.

The step of concurrently forming the channel stop region 118 and the fourth doped layer 116 may also be performed by other methods, for example ion implantation and drive-in.

In addition, the second window 112 may be included in the first mask pattern 104 of FIG. 8A and covered with a thin insulating layer such as oxide during the formation of the third doped layer 108 and subsequently reopened in the step of forming the channel stop region 118 and fourth doped layer 116.

With reference to FIG. 8C, an anode electrode 122 and cathode electrode 124 are attached to the diode. In this embodiment, the first mask pattern 104 of FIG. 8B is removed and an insulating layer 120, for example, an $SiO_2$ layer, is formed on the first doped layer 102. The insulating layer in this example is selectively etched to form a third window exposing the third doped layer 108 and the fourth doped layer 116. A conductive layer, such as aluminum, is then formed on a surface of the insulating layer 120 and then patterned to form the anode electrode 122 connected to the third doped layer 108 and the fourth doped layer 116. In this example, the cathode electrode 124 is formed by depositing a metal material such as aluminum, on the first doped layer.

According to the method for manufacturing the diode in accordance with the second embodiment of the present invention, the third doped layer 108 has an undulating shaped junction, so that an impurity ring layer for increasing the breakdown voltage of the diode is not required and thus a mask process for forming the ring layer is not additionally required, thereby reducing the number of total processing steps. The undulating shaped junction is deep, thus a reliable ohmic anode electrode contact is formed. Also, the third doped layer 108 is concurrently formed together with the channel stop region 118, thereby further minimizing the required number of process steps.

Electrical simulations of diodes formed in accordance with the prior art methods and with the present invention were performed to compare the recovery times obtainable from an example of each.

Simulation measurements of a diode formed in accordance with the first prior art method (see FIG. 1) show that electron current is more than 48% of hole current in a diode device having a P-layer 16 junction depth of 2.2 $\mu$m, at an arbitrary forward current value and a forward voltage drop of 2.10 Volts. In this simulation, the electron minority carrier life time, i.e., the recovery time, was 56 nanoseconds.

Simulation measurements of a diode formed in accordance with the second prior art method (see FIG. 3) show that hole current is more than 16% of electron current in a diode device having a P-layer 38 junction depth of 18 $\mu$m at the same arbitrary forward current value, and a forward voltage drop of 2.13 Volts. In this simulation, the electron minority carrier life time was 25 nanoseconds.

Simulation measurements of a diode formed in accordance with the method of the present invention (see FIG. 5) show that electron current is more than 77% of hole current in a diode device having a P-layer 56 junction depth of 18 $\mu$m at the same arbitrary forward current value, and a forward voltage drop of 2.11 Volts. In this simulation, the electron minority carrier life time was 85 nanoseconds.

The simulation results show that the diode formed in accordance with the present invention has a higher proportion of electron current to hole current in a forward bias state than that of diodes formed in accordance with the prior art. Thus a diode formed in accordance with the method of the present invention exhibits an enhanced characteristic of soft recovery when compared to diodes formed using methods in accordance with the prior art techniques.

Moreover the diode of the present invention exhibits increased electron minority carrier injection to an anode impurity region by utilizing a counter-doped region in the anode impurity region thereby enhancing the characteristic of soft recovery when compared to the method according to the second prior art technique.

In addition, the diode of the present invention is formed by a reliable method which avoids the use of a shallow doped region as in the diode formed in accordance with the first prior art technique.

In addition, the method of forming the diode of the present invention uses minimal processing steps and does not require additional steps for the inclusion of rings for increasing a reverse breakdown voltage.

While this invention has been particularly shown and described with reference to the preferred embodiments, it will be understood by those skilled in the art that various changes in form and detail may be made without departing from the spirit and scope of this invention.

What is claimed is:

1. A semiconductor diode comprising:
   a cathode region of a first conductivity type including at least a first doped layer and a second doped layer, wherein the second doped layer is attached to a first electrode;
   an anode region including a first well region of a second conductivity type formed in the first doped layer and a plurality of second well regions of the first conductivity type formed in the first well region, wherein a second electrode is attached to the first well region and the plurality of second well regions; and
   a junction between the first doped layer and the first well region.

2. The diode of claim 1, wherein the junction has an undulating shape.

3. The diode of claim 1, wherein the junction has a depth of at least 18 $\mu$m.

4. The diode of claim 1, wherein the plurality of second well regions have a thickness of at least 6 $\mu$m.

5. The diode of claim 1, further comprising a channel stop region of a first conductivity type.

6. The diode of claim 1, wherein the first conductivity type is N and the second conductivity type is P.

7. The diode of claim 1, wherein one of the first doped layer, the second doped layer, the first well region and the plurality of second well regions includes epitaxial silicon.

8. A semiconductor device comprising:
   a first doped layer of a first conductivity type having a low impurity density and opposing first and second surfaces;
   a second doped layer of the first conductivity type having a high impurity density relative to the first doped layer and opposing first and second surfaces, the second surface of the first doped layer and the first surface of the second doped layer adjoining each other;
   a first well region of a second conductivity type formed in the first surface of the first doped layer and having a relatively low impurity density;
   a plurality of second well regions of the first conductivity type formed in the first well region and having a high impurity density relative to the first doped layer;
   a first electrode attached to the second surface of the second doped layer; and
   a second electrode attached to upper surfaces of the first well region and the plurality of second well regions.

9. The semiconductor device of claim 8, further comprising a channel stop region of the first conductivity type formed in the first doped layer and having relatively high impurity density.

10. The semiconductor device of claim 9, wherein the channel stop region comprises a third well region in the first doped layer.

11. The semiconductor device of claim 9, wherein the channel stop region and the plurality of second well regions have substantial equal depth.

12. The semiconductor device of claim 8, wherein a junction between the first well region and the first doped layer has an undulating shape.

13. The semiconductor device of claim 8, wherein a junction between the first well region and the first doped layer has a depth of at least 18 $\mu$m.

14. The semiconductor device of claim 8, wherein the plurality of second well regions have a thickness of at least 6 $\mu$m.

15. The semiconductor device of claim 8, wherein the first conductivity type is N and the second conductivity type is P.

16. The semiconductor device of claim 8, wherein the first well region comprises a plurality of wells diffused to merge together.

\* \* \* \* \*